(12) United States Patent
Martini

(10) Patent No.: US 6,614,277 B1
(45) Date of Patent: Sep. 2, 2003

(54) CIRCUIT FOR PROVIDING A MINIMUM WAKE-UP TIME IN THE WAKE-UP LOGIC CIRCUITS

(75) Inventor: Marco Martini, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/597,875

(22) Filed: Jun. 20, 2000

(30) Foreign Application Priority Data

Jun. 22, 1999 (IT) .......................................... MI99A1386

(51) Int. Cl.⁷ ................................................ H03K 3/10
(52) U.S. Cl. ........................ 327/227; 327/173; 327/174
(58) Field of Search ................................. 327/174, 176, 327/197, 199, 291, 299, 294, 34, 173, 227, 172, 175

(56) References Cited

U.S. PATENT DOCUMENTS

| | | | | |
|---|---|---|---|---|
| 5,264,737 A | * | 11/1993 | Oikawa ...................... 327/172 |
| 5,309,034 A | * | 5/1994 | Ishibashi ..................... 327/174 |
| 5,315,184 A | * | 5/1994 | Benhamida ................... 327/19 |
| 5,506,532 A | * | 4/1996 | Milazzo ....................... 327/175 |
| 5,506,533 A | * | 4/1996 | Wu .............................. 327/227 |
| 5,642,068 A | * | 6/1997 | Wojcicki et al. ............. 317/172 |

\* cited by examiner

*Primary Examiner*—Tuan T. Lam
*Assistant Examiner*—Hiep Nguyen
(74) *Attorney, Agent, or Firm*—Lisa K. Jorgenson; E. Russell Tarleton; SEED IP Law Group PLLC

(57) ABSTRACT

A circuit for providing a minimum wake-up time, in which a monostable circuit generates the WAKE-UP signal for a time at least as long as a minimum time established by the monostable circuit. The circuit is structured to extend the WAKE-UP signal for a time necessary to equal the minimum time that is established by the monostable circuit and to disable the WAKE-UP signal at the end of the variation of the input signal of the device being controlled.

9 Claims, 5 Drawing Sheets

CIRCUIT FOR PROVIDING A MINIMUM WAKE-UP TIME IN THE WAKE-UP LOGIC CIRCUITS

TECHNICAL FIELD

The present invention refers to a circuit for providing a minimum wake-up time ("awakening") in wake-up logic circuits.

BACKGROUND OF THE INVENTION

An object in the provision of an electronic system is to reduce the power dissipations in a consistent way. A pursuable way to obtain this is to provide that those parts of the system that react to sporadic events are set in a state of stand-by, also called "energy saving." In order to enable these parts again, a specific signal is used that is generated by a circuitry called "wake-up circuitry."

The function of this wake-up circuitry is to compare the input and output signals of a device to be controlled in a such way that it is possible to detect variations in the state of the device. The wake-up circuitry can also be integrated inside any device of the system, such as a buffer, counters, a shift register, etc., that function as an interface between the aforesaid sporadic events and the rest of the system.

The wake-up circuitry is characterized by two fundamental parameters: (1) minimum input pulse; and (2) minimum duration of the wake-up signal.

The minimum input pulse represents the minimum time length that a variation of the input state of the wake-up circuitry must have in order for said circuitry to generate the wake-up signal.

The minimum duration of the wake-up signal represents the minimum time length that the wake-up signal must have once it has been enabled, that is once the wake-up signal is brought to a low logic level. Once this minimum time has elapsed, the signal will return to the initial state, that is to a high logic level, when the inputs and the outputs of the device being controlled become equal again.

Known circuit solutions have the problem that once the minimum time in which the signal must be enabled has elapsed, that is at a low logic level, said signal shows a time delay in going back to the initial state, that is when the inputs and the outputs of the device being controlled coincide again.

SUMMARY OF THE INVENTION

In view of the state of the art described, the disclosed embodiments of the present invention fulfill the second parameter that characterizes the wake-up circuitry, providing a minimum duration wake-up signal.

According to the embodiments of the present invention, this is achieved by means of a circuit for providing minimum wake-up time that includes a monostable circuit suitable to disable the wake-up signal when said signal has been enabled for a time that is longer than a minimum time established by said monostable circuit and after the input and output signals of the controlled device coincide.

With the embodiments of the present invention it is possible to provide a circuit that guarantees the minimum period in which the wake-up signal remains enabled so that at the end of said period the wake-up signal can go back to the initial state without any delay when the input and output signals of the device being controlled will coincide again.

BRIEF DESCRIPTION OF THE DRAWINGS

The characteristics and the advantages of the present invention will become evident by the following detailed description of an embodiment thereof, which is illustrated as a non-limiting example in the enclosed drawings, in which.

DETAILED DESCRIPTION OF THE INVENTION

Figure 1:
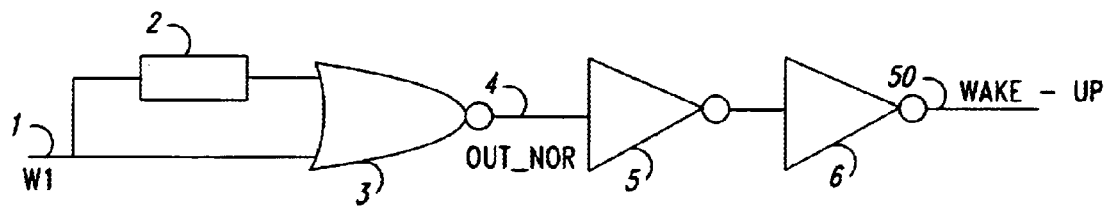
FIG. 1 shows a circuit that is necessary to guarantee the minimum duration of the WAKE-UP signal according to the known art.

In FIG. 1 a circuit to guarantee the minimum duration of the WAKE-UP signal according to the known art is shown.

According to the illustrated circuit, it is possible to observe that the signal W1 that is present on the line 1 is the input of a delay network 2, that is necessary to guarantee the duration of the minimum wake-up time, and the input of a NOR logic block 3. Said block has the signal coming from said delay network as another input 2. Said block 3 has a high signal on the OUT_NOR output line 4 only if both the inputs are low.

In addition it is possible to observe a logic inverter block 5, that has the output of block 3 as input signal, and a logic inverter block 6 that has the output of block 5 as input. The output signal of the block 6 is the WAKE-UP signal 50.

When there is a sufficiently long variation in duration, the signal W1 present on the line 1 switches from zero to one and the output of the logic block 3 goes to the zero level thus activating the WAKE-UP signal, that is, setting the output of the inverter 6 at a low level.

When the signal W1 that is present on the line switches from one to zero the output of the NOR logic block 3 goes back to one, thus disabling the WAKE-UP signal, that is setting a high value on the output line of the block 6 only when both the inputs are at zero, and this takes place only after the delay time that is introduced by the delay network 2. This transition of the WAKE-UP signal from enabled to disabled takes place independently from the time it remains in the state one of the signal W1 and therefore from the time elapsed since the variation of the input signal. Therefore the WAKE-UP signal is always disabled after the delay introduced by the delay network 2.

Figure 2:
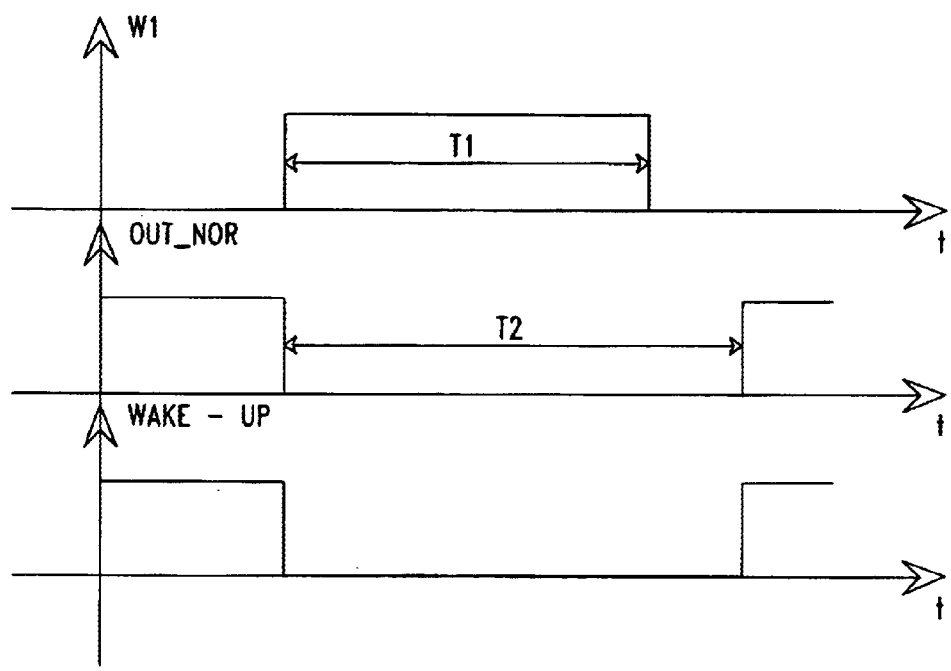
FIG. 2 illustrates it in a schematic way the time waveforms of the various signals that are present in the circuit of FIG. 1.

In FIG. 2 the time waveforms of the various signals that are present in the circuit in FIG. 1 are illustrated in a schematic way.

According to what is illustrated in FIG. 2, it is possible to observe a plurality of axes of abscissas indicating the time and an axis of ordinates indicating the logic state of the signals.

The first diagram represents the trend of the signal W1 and it is possible to observe that this remains enabled for a period T1. The second diagram shows the trend of the OUT_NOR output signal of the logic block 3 and it is possible to observe that it is at a low logic level for time T2=T1+T$_{delay}$ where T$_{delay}$ represents the delay that is introduced by the delay network 2. The third diagram shows the trend of the WAKE-UP signal that is the output of the inverter 6 and it is possible to observe that the period during which it remains enabled has a duration equal to T2.

Figure 3:
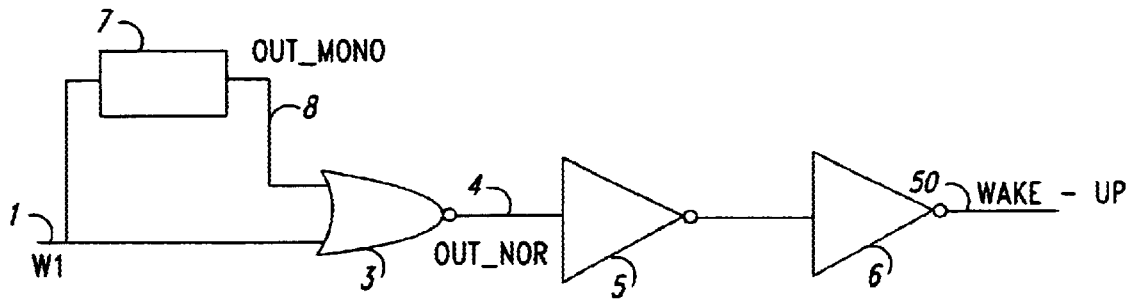
FIG. 3 shows a schematic representation of the circuit that is necessary to guarantee the minimum duration of the WAKE-UP signal according to the present invention.

In FIG. 3 there is shown a schematic principle representation of the circuit that is necessary to achieve the minimum duration of the WAKE-UP signal according to the present invention.

According to what illustrated in FIG. 3, it is possible to observe that the signal W1 is the input of the NOR logic block 3 and of a block 7 representing a monostable circuit, that is a circuit that allows a single possible state.

This solution enables implementation of a circuit in which, if the WAKE-UP signal has been enabled for a time longer than the established minimum, it can be disabled without delays; otherwise time must wait until said WAKE-UP signal remains enabled for a time necessary to equal the minimum time required and subsequently it can be disabled.

In fact, when the signal W1 switches from zero to one and it remains enabled for a time longer than the minimum time, the signal that is generated by the circuit 7 is already at the logic level zero, as it will be described in detail later in FIG. 4. Therefore, in this case, the block 3 executes switching from zero to one as soon as the signal W1 switches from one to zero.

When the signal W1 switches from one to zero and the WAKE-UP signal has not reached the minimum duration period in the low state yet, that is in the enabled state, the pulse of the circuit 7 has not ended yet, and therefore the output 8 is still at one. This involves the OUT_NOR output of the block 3 not switching until the output of the circuit 7 returns to zero, that is after a minimum period since the moment in which the signal W1 has been enabled, as will be described in detail later in FIG. 4.

Therefore if the delay is adequately sized, the WAKE-UP signal will be disabled after a time equal to the minimum duration of the WAKE-UP signal since the end of the variation of the input W1.

Figure 4:
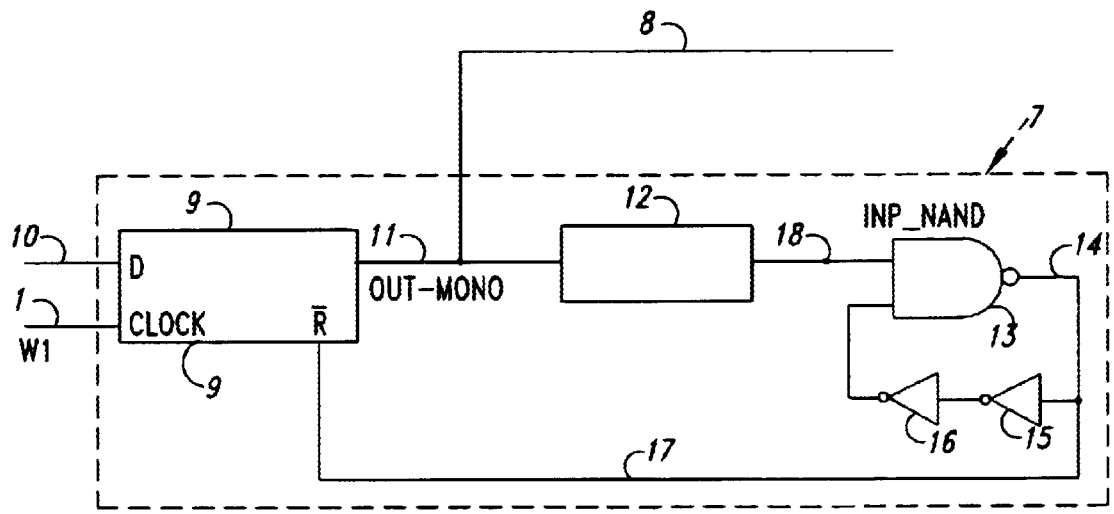
FIG. 4 illustrates a specific circuit embodiment of a portion of the circuit in FIG. 3.

In FIG. 4 a specific circuit embodiment of a portion of the circuit in FIG. 3 is illustrated, in particular of the monostable circuit 7.

According to what illustrated in FIG. 4, it is possible to observe that the signal W1 is the input of a bistable block 9, called a flip-flop. This input is also called CLOCK and it has the function to establish the interval of time during which the flip-flop acquires the value that is present on a line 10 in order to store it. This line 10 is called D and on it a datum to be stored is set. In the Figure under examination the value of the line 10 is high, that is one. In addition, the block 9 has an output signal 11, that coincides with the output 8 of the monostable circuit 7, called OUT-MONO.

The truth table of the D flip-flop (OFF) is the following:

| CLOCK | complemented R | OUT-MONO |
|---|---|---|
| Anyone | 0 | 0 |
| Low to High | 1 | 1 |
| High | 1 | memorize |
| Low | 1 | memorize |
| High to Low | 1 | memorize |

The stable state of the flip-flop is as a result the one for which the output signal 11 is equal to zero and the complemented R input is equal to one.

When the clock input of the block 9 receives the transition of the signal W1 that goes from low to high logic level, the output signal 11 of the block 9 goes to a high logic level, and it determines the generation of the output 8 on behalf of the monostable circuit 7.

After a delay time, introduced by the delay network 12, the output signal 11 of the block 9 goes to an INP_NAND input 18 of a logic NAND block 13. Through the feedback, consisting of the series of inverters 15 and 16, the signal present on the line 14 is transferred to the other input of the block 13. This implies that the output of the block 13 goes to zero if both inputs are at a high logic level.

As a consequence what occurs is that the block 9 is thus reprogrammed and therefore there is the end of the output signal 11, that is the output 8 of the monostable circuit 7 becomes zero again. The line 17 that goes to an input of the block 9, said complemented R, goes back to one, and this until a new upward commutation of the signal W1 takes place.

Therefore the duration of the output 8 that is generated by the monostable circuit is determined by the delay introduced by the delay network 12.

Figure 5:
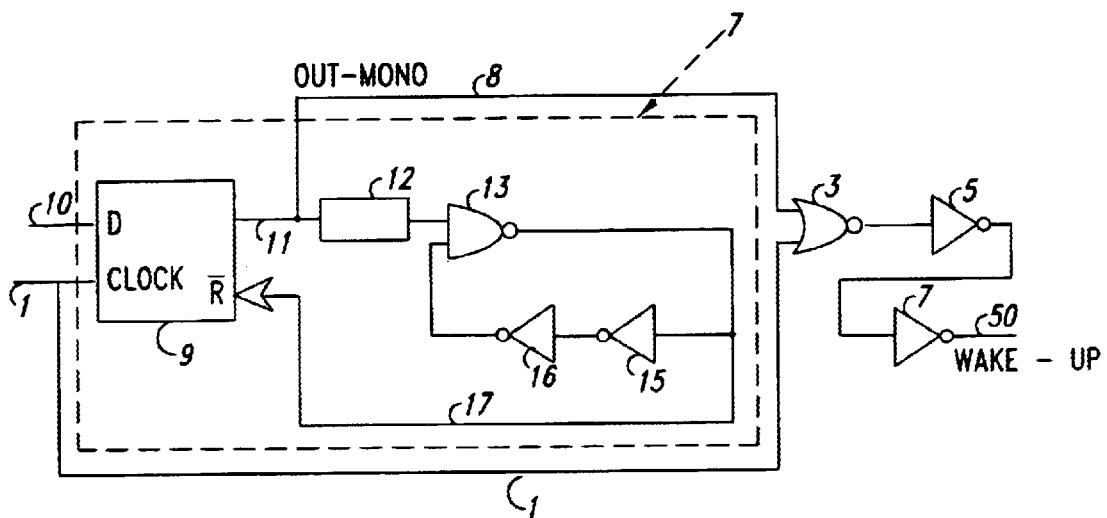
FIG. 5 shows a global representation of the circuit according to the present invention.

According to what is illustrated in FIG. 5, it is possible to observe that it is the composition of the circuit layout that is proposed in FIG. 3 and of the layout proposed in FIG. 4. The result is that the output signal 11 of the bistable block 9 is the input line of the NOR logic block 3 and the other input is still the signal W1.

The circuit thus implemented achieves the minimum duration of the WAKE-UP signal. The value of the time length of the WAKE-UP signal can change for different circuit typologies but the architecture of the solution being proposed remains unchanged.

Figure 6:
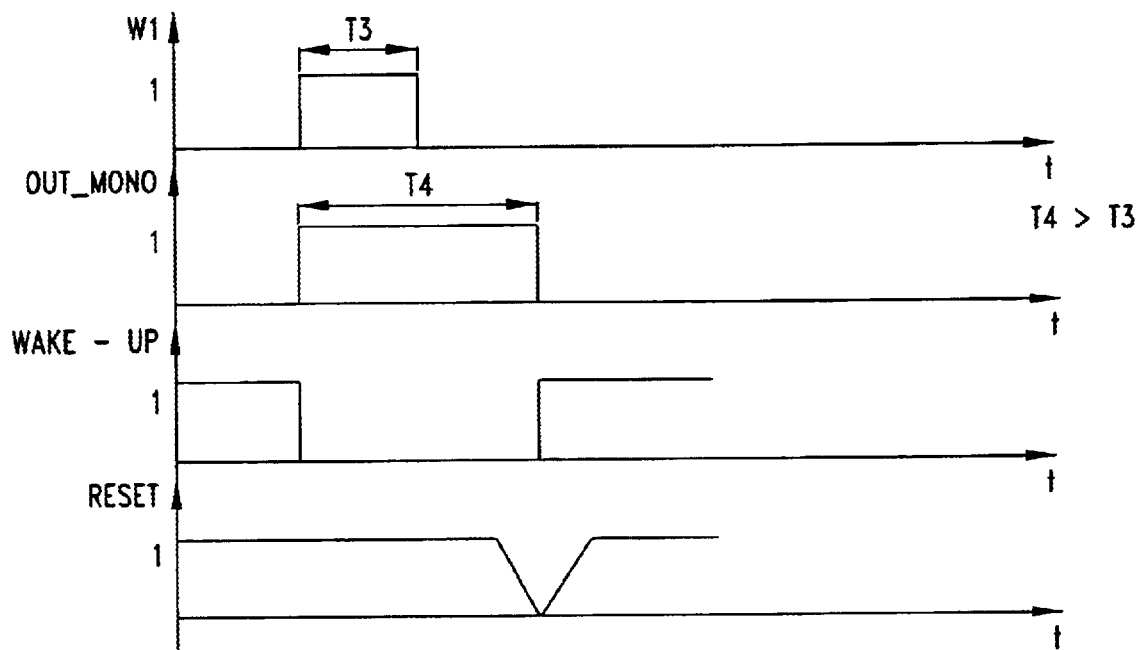
FIG. 6 illustrates in a schematic way time waveforms of the various signals present in the circuit in FIG. 5 when a pulse has a shorter duration than the duration of the minimum wake-up time.

In FIG. 6 there are illustrated in a schematic way several time waveforms of the various signals that are present in the circuit in FIG. 5 when a pulse has duration lasting less than the minimum wake-up time.

According to what illustrated in FIG. 6, it is possible to-observe a plurality of axes of abscissas indicating the time and an axis of ordinates indicating the logic state of the signals.

The first diagram represents the trend of the signal W1, and it is possible to observe that this remains enabled for a period T3. The second diagram represents the output 8 of the monostable circuit 7, OUT_MONO, and it is possible to observe that it remains enabled for a T4, with T4>T3. The third diagram represents the output signal of the inverter 6, that is the WAKE-UP signal. The fourth diagram represents the complemented R signal.

As it is possible to deduce from the diagram, this is a condition in which T3<T4, and therefore the WAKE-UP signal, because of the fact that W1 is already commuted, must wait for the OUT_MONO signal to commute; that is, the complemented R signal reprograms the flip-flop 9 so that it is possible to disable said WAKE-UP signal.

Figure 7:
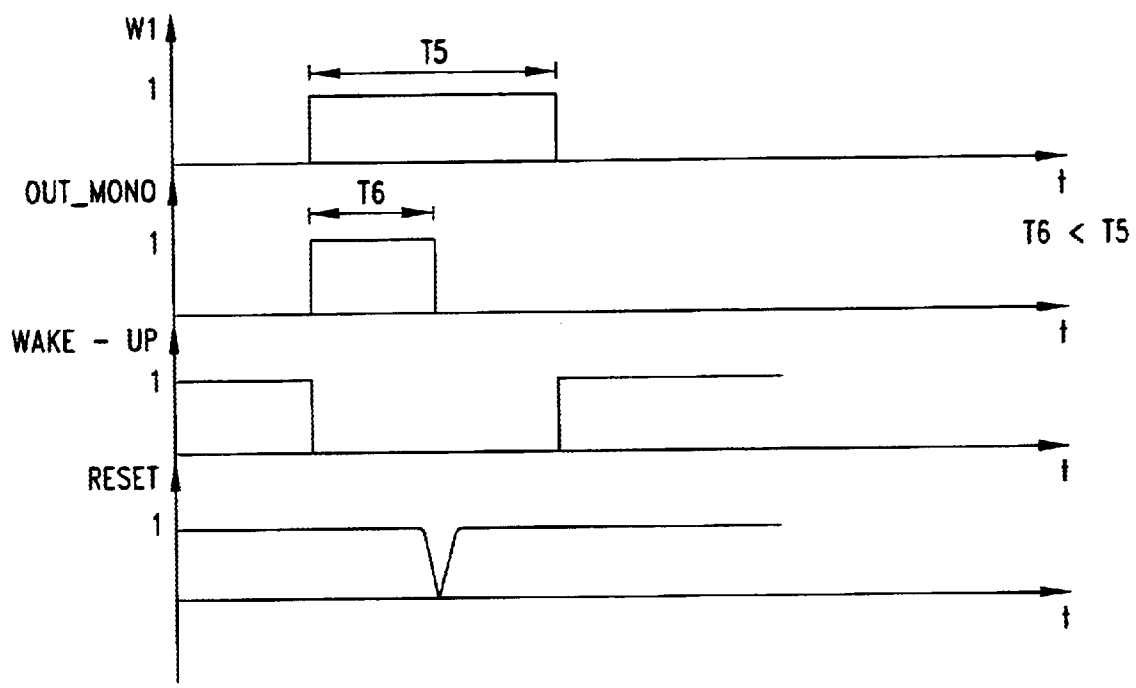
FIG. 7 illustrates time waveforms of the various signals present in the circuit in FIG. 5 when a pulse has a duration that is longer than the duration of the minimum wake-up time.

In FIG. 7 other time waveforms of the various signals that are present in the circuit in FIG. 5 are illustrated when a pulse lasts longer than the duration of the minimum wake-up time.

According to what illustrated in FIG. 7, it is possible to observe a plurality of axes of abscissas indicating the time and an axis of ordinates indicating the logic state of the signals.

The first diagram represents the trend of the signal W1, and it is possible to observe that it remains enabled for a period T5. The second diagram represents the output 8 of the monostable circuit 7, OUT_MONO, and it is possible to observe that it remains enabled for a period T6, with T6<T5. The third diagram represents the output signal of the inverter 6, that is the WAKE-UP signal. The fourth diagram represents the complemented R signal.

As it is possible to deduce from the diagram this is the condition in which T6<T5 and therefore the WAKE-UP signal responds to the transitions of W1 in an instantaneous way because said WAKE-UP signal has been enabled for a time longer than the established minimum.

In addition it is possible to observe that the OUT_MONO and RESET signals are identical in FIGS. 6 and 7.

Figure 8:
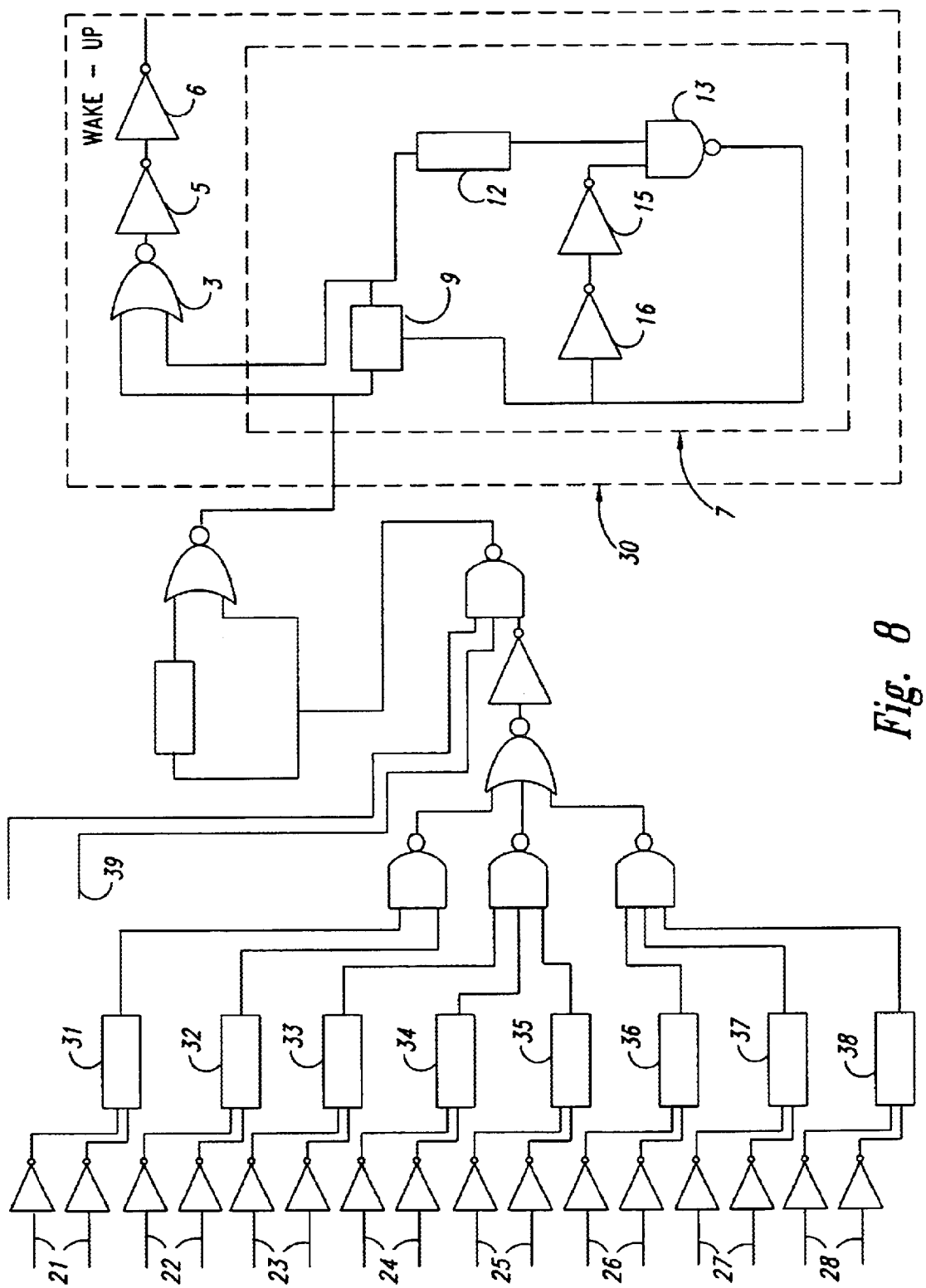
FIG. 8 shows a more complete circuit embodiment of the present invention.

In FIG. 8 a more complete circuit embodiment of the present invention is shown.

In such figure by 30 the logic wake-up circuit is indicated as a whole. Such circuit through a plurality of couples of terminal 21, 22, 23, 24, 25, 26, 27 and 28 receives in input the input and output signals of a device to be controlled. This device can be a shift-register, a counter, or a latch.

The block 30 generates an output signal called WAKE-UP signal through the output of the inverter 6. This signal has the function to detect possible variations in the input state of the device being controlled. As it is possible to deduce from such figure, the block 30 coincides with the circuit that has been analyzed in FIG. 5 and said block 30 has the function of determining the duration of the pulse of the monostable circuit 7 through the time delay that is introduced by the delay network 12.

The functionality of the block 30 is obtained through a plurality of XNOR blocks 31, 32, 33, 34, 35, 36, 37 and 38. Through said XNOR blocks the inputs of the device to be controlled are compared with the corresponding outputs of the same device. An output signal from said XNOR blocks is obtained that has a high logic level only when the signals making up the input/output couples both have the same logic value, that is either they are both at a low logic value or they are both at a high logic value.

In addition it is possible to observe a CLOCK signal 39 that has the function of synchronizing all the signals with the front valid for the acquisition of the data and to establish the interval of time during which the flip-flop 9 acquires the value to store it inside of it.

Figure 9:
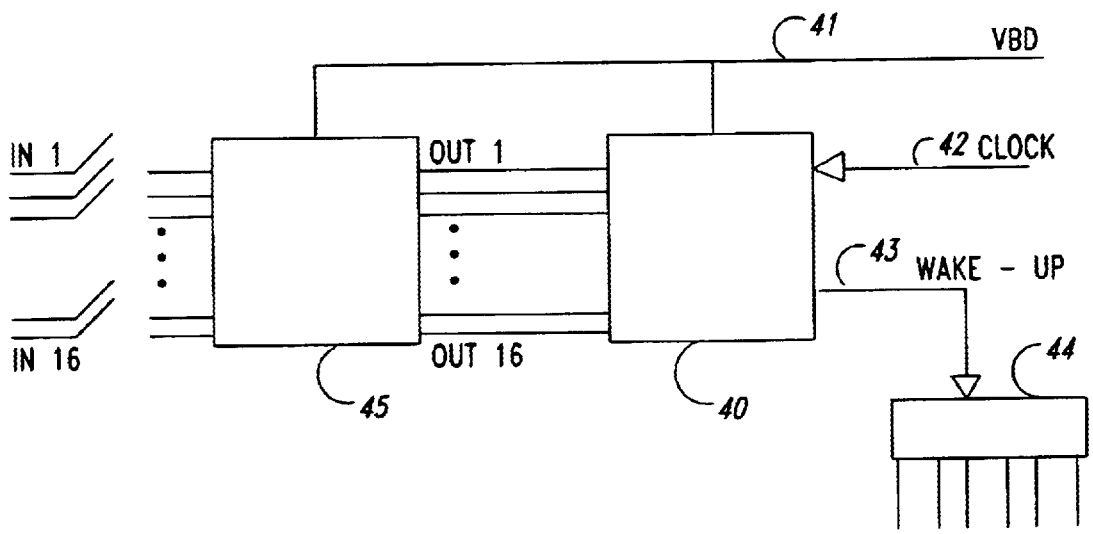
FIG. 9 illustrates a possible example of implementation of the wake-up logic.

In FIG. 9 a possible example of implementation of the wake-up logic for the automobile market is illustrated. As shown therein, the circuitry to realize the WAKE-UP signal is integrated inside a shift register 40. The shift register 40 receives an input supply line Vdd 41 and a CLOCK signal 42, having the function to time all the signals that re present on the enabled front. The shift register 40 generates a WAKE-UP signal 43 that flows in input to a microcontroller 44. This WAKE-UP signal 43 has the function to enable the microcontroller 44, in a such way that said microcontroller 44 can respond to sporadic events like the signaling of open doors or of possible malfunctioning of the motorcar.

The device that is controlled by the wake-up logic 40 is a level—shifting circuitry 45.

This block 45 receives a plurality of input signals IN1 . . . IN16 and it generates a plurality of output signals OUT1 . . . OUT16. Said signals are the inputs of the shift—register with wake-up circuitry 40, on the bases of which said circuitry generates the WAKE-UP signal 43.

While preferred embodiments of the invention have been illustrated: and described, it is to be understood that various changes maybe made therein known to those skilled in the art without departing from the spirit and scope of the invention. Thus, the invention is to be limited only by the scope of the claims that follow.

What is claimed is:

1. A circuit for providing a wake-up signal, comprising:
a monostable circuit that is configured to generate an OUT-MONO signal upon receipt of an input signal for a delay time established by the monostable circuit, and to not generate the OUT-Mono signal after the delay time established by said monostable circuit has elapsed, the monostable circuit comprising a delay network configured to establish the delay time; and
an output logic circuit configured to generate the WAKE-UP signal in response to receipt of either one of the OUT-MONO signal and the input signal, and not to generate the wake-up signal in the absence of both the OUT-MONO signal and the input signal, wherein said monostable circuit comprises a bistable block having the input signal and a reset signal as an input and the OUT-MONO signal as an output.

2. The circuit of claim 1, wherein the output of said bistable block is the input of said delay network and the output of said delay network is an input of a NAND logic block, the output of which is the input of a series of block inverters, where said block inverters are set on a feedback line coupled to the other input of said logic NAND block, the output of which forms said reset signal.

3. The circuit of claim 2 wherein said output signal OUT-MONO is an input of a NOR logic block in the output logic circuit and said input signal is another input of said NOR logic block, and that the output of said NOR logic block is the input of a series of inverters in the output logic circuit, whose output is the WAKE-UP signal.

4. A wake-up circuit for generating a WAKE-UP signal, comprising:
a monostable circuit having an input coupled to an input signal source to receive an input signal therefrom and an output, the monostable circuit configured to output an output signal in response to receipt of the input signal and for a delay time established by the monostable circuit, and to not output the output signal when the output signal has been generated for a period of time longer than the delay time established by the monostable circuit, the monostable circuit comprising a flip-flop circuit having an input terminal coupled to a datum signal, a clock terminal coupled to the input signal source, and an output, the monostable circuit further comprising a delay circuit structured to determine the duration of the delay time, the delay circuit have an input coupled to the output of the flip-flop and an output coupled to a reset input of the flip-flop; and
a first logic circuit having a first input coupled to the input signal source to receive the input signal, a second input to receive the output signal from the monostable circuit, and an output, the first logic circuit configured to output the WAKE-UP signal in response to receipt of either one or both of the input signal and the output signal and to not output the WAKE-UP signal in the absence of the input signal and the output signal.

5. The circuit of claim 4, wherein the first logic circuit comprises a NOR logic gate.

6. The circuit of claim 4, wherein the first logic circuit comprises a first inverter coupled in series to a second inverter, with an input of the first inverter coupled to the output of the first logic gate and an output of the second inverter comprising an output of the wake-up circuit.

7. A circuit for providing a minimum wake-up time, comprising:

an output logic circuit configured to receive an input signal, an output signal, and to output a WAKE-UP signal upon receipt of either one or both of the input signal and the output signal and to not generate the WAKE-UP signal in the absence of both the input signal and the output signal; and a monostable circuit configured to generate the output signal in response to receipt of the input signal and for a delay time established by the monostable circuit, and to not generate the output signal when the delay time established by the monostable circuit has lapsed, the monostable circuit comprising a delay network configured to establish the delay time and a bistable block receiving the input signal and a reset signal and generating the output signal, the output of the bistable block is connected to the input of the delay network, and the output of the delay network is connected to an input of a NAND logic block, the output of which is the input of a series of block inverters, where the block inverters are set on a feedback line coupled to the other input of the logic NAND block, the output of which forms the reset signal.

8. A circuit for providing a minimum wake-up time, comprising:

an output logic circuit configured to receive an input signal, an output signal and to output a WAKE-UP signal upon receipt of either one or both of the input signal and the output signal and to not generate the WAKE-UP signal in the absence of both the input signal and the output signal; and a monostable circuit configured to generate the output signal in response to receipt of the input signal for a delay time established by the monostable circuit, and to not generate the output signal when the delay time established by the monostable circuit has lapsed, the monostable circuit comprising a delay network configured to establish the delay time and a bistable block receiving the input signal and a reset signal are generating the output signal, the output of the bistable block is connected to the input of the delay network, and the output of the delay network is connected to an input of a NAND logic block, the output of which is the input of a series of block inverters, where the block inverters are set on a feedback line coupled to the other input of the logic NAND block, the output of which forms the reset signal, the output logic circuit is connected to a NOR logic block configured to receive the input signal and the output signal from the monostable circuit, and the NOR logic block having an output connected to an input to a series of inverters, the output of which is WAKE-UP signal.

9. A wake-up circuit for generating a WAKE-UP signal, comprising:

a monostable circuit having an input coupled to an input signal source to receive an input signal therefrom and an output, the monostable circuit configured to output an output signal in response to receipt of the input signal for a delay time established by the monostable circuit, and to not output the output signal when the wake-up signal has been generated for a period of time longer than the delay time established by the monostable circuit, the monostable circuit comprising a flip-flop circuit having an input terminal coupled to a datum signal, a clock terminal coupled to the input signal source, and an output, the monostable circuit further comprising a delay circuit structured to determine the duration of the delay time, the delay circuit have an input coupled to the output of the flip-flop and an output coupled to a reset input of the flip-flop; and a first logic circuit having a first input coupled to the input signal source to receive the input signal, a second input to receive the output signal from the monostable circuit, and an output, the first logic circuit configured to output the wake-up signal in response to receipt of either one or both of the input signal and the output signal and to not output the wake-up signal in the absence of both the input signal and the output signal, the first logic circuit comprising a first inverter coupled in series to a second inverter, with an input of the first inverter coupled to the output of a first logic gate, and an output of the second inverter is an output of the wakeup circuit.

\* \* \* \* \*

UNITED STATES PATENT AND TRADEMARK OFFICE
CERTIFICATE OF CORRECTION

PATENT NO. : 6,614,277 B1
DATED : September 2, 2003
INVENTOR(S) : Marco Martini

It is certified that error appears in the above-identified patent and that said Letters Patent is hereby corrected as shown below:

Column 6,
Line 26, after "delay time" should read -- and a bistable block that receives the input signal and a reset signal as inputs and generates the OUT-MONO signal as an output; --.

Column 7,
Line 41, "an output signal" should read as -- an output signal from a monostable circuit, --.

Column 8,
Lines 4 and 5, "a reset signal are generating the output signal," should read as -- a reset signal, and generating the output signal, --.
Lines 16 and 17, "to a series of inverters, the output of which is WAKE-UP signal." should read as -- of a series of inverters, the output of which is the WAKE-UP signal. --
Line 44, "circuit comprising a first inverter" should read as -- circuit is a first inverter --.
Line 47, "is an output" should read as -- connected to an output --.

Signed and Sealed this

Thirteenth Day of April, 2004

JON W. DUDAS
*Acting Director of the United States Patent and Trademark Office*